United States Patent [19]

Aso

[11] Patent Number: 4,933,575
[45] Date of Patent: Jun. 12, 1990

[54] ELECTRIC CIRCUIT INTERCHANGEABLE BETWEEN SEQUENTIAL AND COMBINATION CIRCUITS

[75] Inventor: Akira Aso, Tokyo, Japan

[73] Assignee: NEC Corporation, Tokyo, Japan

[21] Appl. No.: 310,443

[22] Filed: Feb. 14, 1989

[30] Foreign Application Priority Data

Feb. 15, 1988 [JP] Japan .................................. 63-33338

[51] Int. Cl.⁵ .................... H04Q 1/00; H03K 17/693;
                                    H03K 19/096; H03K 3/01
[52] U.S. Cl. .................................... 307/465; 307/468;
                    307/469; 307/475; 364/716; 364/784;
                    340/825.84; 340/825.86; 340/825.87;
                                                    340/825.91
[58] Field of Search ............. 307/465, 465.1, 466–468,
            307/469, 471, 443, 448, 451, 452, 453, 272.1,
            279, 592, 596, 475; 364/716, 784; 340/825.83,
                                    825.84, 825.85–825.91

[56] References Cited

U.S. PATENT DOCUMENTS

| | | | |
|---|---|---|---|
| 4,742,252 | 5/1988 | Agrawal | 307/465 |
| 4,745,573 | 5/1988 | Lebel | 307/465 X R |
| 4,783,606 | 11/1988 | Goetting | 307/465 |
| 4,786,829 | 11/1988 | Letcher | 307/465 |

*Primary Examiner*—Stanley D. Miller
*Assistant Examiner*—David R. Bertelson
*Attorney, Agent, or Firm*—Helfgott & Karas

[57] ABSTRACT

There is provided a logic circuit formed of a flip-flop receiving an input data, a control signal, a set signal and a reset signal and producing an output signal and an inverted output signal. To this is added a first logic circuit performing a first logical arithmetic of the input data and the set signal to produce a first logic signal, and a second logic circuit performing a second logical arithmetic of the control signal and the reset signal to produce a second logic signal. A first selector circuit selects one of the first logic signal and the output signal and a second selector circuit selects one of the second logic signal and the inverted output signal thereby providing convesability between sequential and combination modes of operation.

5 Claims, 3 Drawing Sheets

ELECTRIC CIRCUIT INTERCHANGEABLE BETWEEN SEQUENTIAL AND COMBINATION CIRCUITS

BACKGROUND OF THE INVENTION

1. Field of the Invention

This invention relates to an electric circuit usable in a large-scale logic IC and more particularly to a sequential circuit having a construction which may be easily changed to a combination circuit.

2. Description of the Related Art

A design of the electric circuits in a logic IC for testability becomes important as the integration density in the logic IC is greatly increased. A flip-flop circuit is a basic circuit in a logic IC and is frequently used in designing such large-scale IC. There are many problems in testing such large-scale IC which uses a plurality of flip-flops. For example, a signal for testing a particular circuit part in the logic IC must be applied thereto and/or derived therefrom through a large number of flip-flops. This means that a long time and a complex operation are required for the input and/or output of the test signal.

More specifically, a conventional D-type flip-flop circuit 60 is schematically shown in FIG. 1 and has a data input terminal D, a terminal C for a control signal such as a clock signal, a set signal input terminal S, a reset signal input terminal R, an output signal terminal Q and an inverted output signal terminal $\bar{Q}$.

Such a conventional flip-flop 60 as mentioned above is a logic circuit having a very simple function that a set data applied to the data input terminal D is simply transferred to the output signal terminals Q and $\bar{Q}$, basically, by a clock signal applied to the control signal input terminal C. In an electronic circuit wherein a plurality of flip-flop circuits are employed, however, a variety of problems take place on testing combination circuits which are positioned before and after these flip-flop circuits. In order to ascertain the logical operation of a combination circuit which determines the data applied to flip-flop circuits, for instance, it is prerequisite to write these data into the flip-flop circuit group by the clock signal, and thus the number of clocks increases as the complexity of the combination circuit increases. Likewise, in order to ascertain the logical operation of a combination circuit positioned after the flip-flop circuit, all input patterns required therefor need to be impressed from the output of the flip-flop circuit and, therefore, a number of clocks are required for this purpose as well. Furthermore, the above-mentioned two kinds of clock operations are required for ascertaining the logical operation of a combination circuit positioned between flip-flop circuits and, thus, very complicated preparation of test patterns becomes necessary. The complicated preparation can be avoided, if the flip-flop circuit is changed to a combination circuit.

SUMMARY OF THE INVENTION

It is, therefore, a primary object of the present invention to provide an electric circuit including a flip-flop which makes a test of logic IC easy when used in the logic IC.

It is another object of the present invention to provide an electric circuit including a flip-flop which may be easily changed to a combination circuit.

According to the present invention, there is provided an electric circuit including a flip-flop having a data input terminal selectively receiving an input data among at least one input data, a control signal input terminal selectively receiving a control signal among at least one control signal, a set signal input terminal receiving a set signal, a reset signal input terminal receiving a reset signal, an output signal terminal producing an output signal and an inverted output signal terminal producing an inverted output signal. To this flip-flop is added a first logic circuit making a logical arithmetic of the at least one input data and the set signal to produce a first logic signal, a second logic circuit making another logical arithmetic of the at least one control signal and the reset signal to produce a second logic signal, a first selector producing a selective one of the output signal and the first logic signal as a first output of the electric circuit and a second selector producing another selective one of the inverted output signal and the second logic signal as a second output of the electric circuit.

In accordance with the present invention, the electric circuit operates as a flip-flop which is a sequential circuit, if the first and second selectors are respectively made to produce the output and inverted output signals as the first and second output of the electric circuit. The electric circuit also operates as a combination circuit, if the first and second selectors are respectively made to produce the first and second logic signals as the first and second output of the electric circuit. Thus, the electric circuit according to the present invention operates as both sequential and combination circuits and is easy to change between these sequential and combination circuits by a mode switching signal applied to both selectors. Then, if the electric circuit according to the present invention is used in a logic IC as a flip-flop circuit, the logic operation of the IC can be easily tested by changing the flip-flop circuit to a combination circuit.

BRIEF DESCRIPTION OF THE DRAWINGS

The above and further objects, features and advantages of the present invention will become more apparent from the following description taken in conjunction with the accompanying drawings, wherein:

FIG. 2 illustrates a principal construction of the present invention, and a D flip-flop circuit 1 in the figure operates with reception of a data system signal such as data and set signal and control system signal such as clock and reset signal. In accordance with a prescribed combination of input signals of the data system signal and a prescribed combination of the control system signal, an output is generated from a logic circuit 3. An output of the D flip-flop circuit 1 and an output of the logic circuit 3 are selected by a selector circuit 2 in accordance with a mode switching signal as an output generated from the whole circuit.

By this mode switching, a switching can be made over to a sequential circuit and a combination circuit. More specifically, if the selector circuit 2 selects the output of the D flip-flop 1 as the final output, the whole circuit operates as a flip-flop, that is, a sequential circuit. On the other hand, if the selector circuit 2 selects the output of the logic circuit 3 as the final output, the whole circuit operates as a combination circuit which transfers the input signal of data or control system signals or the logical arithmetic signal of the data or control system signals. Thus, the whole circuit is easily changed between the sequential and combination circuits.

Figure 1:
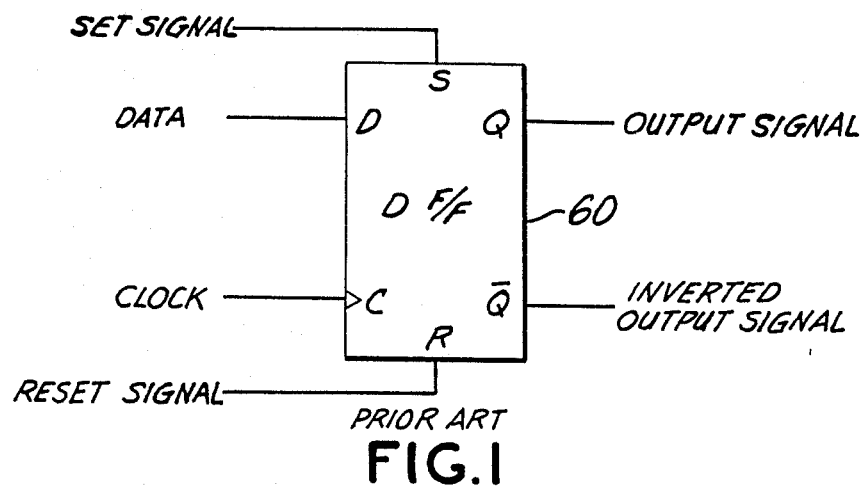
FIG. 1 is a block diagram showing a conventional flip-flop.
Figure 2:
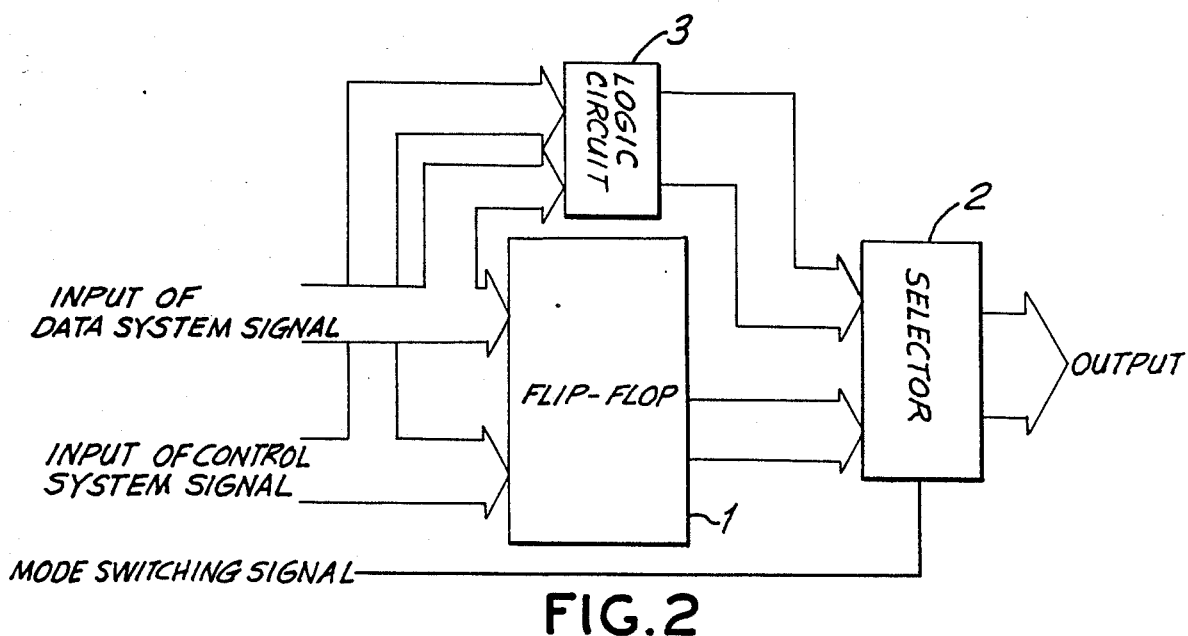
FIG. 2 is a block diagram showing a principle of the present invention.
Figure 3:
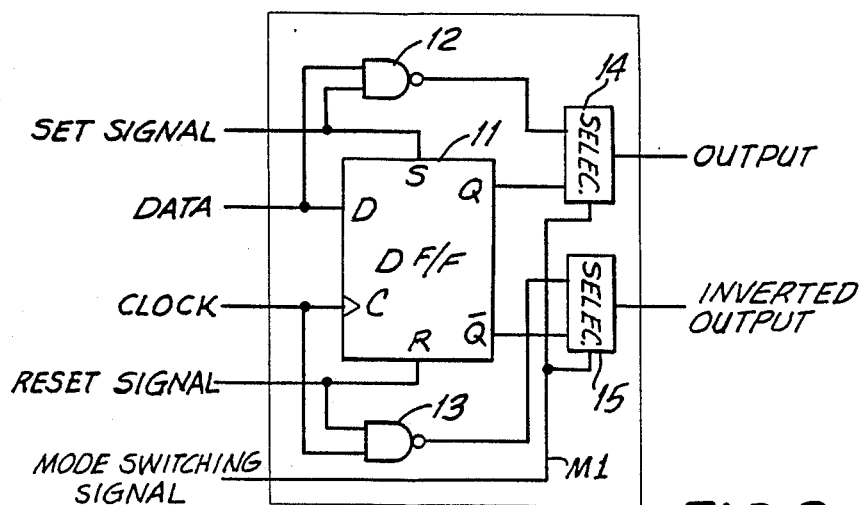
FIG. 3 is a block diagram showing a first embodiment of the present invention.

FIG. 3 is a logical block diagram showing a first embodiment of the present invention. Two-input NAND gates 12, 13 and selector circuits 14, 15 are attached to a D-type flip-flop circuit 11. A set signal applied a set signal terminal S and a data applied to a data input terminal D are connected to the selector circuit 14 through a two-input NAND gate 12, while a clock signal applied to a control signal terminal C and a reset signal applied a reset signal terminal R are connected to the selector circuit 15 through a two-input NAND gate 13. Output signals at output signal terminals Q, Q̄ of the D flip-flop 11 and output of the two-input NAND gates 12, 13 are selected by selector circuits 14, 15 in response to a mode switching signal M1 to be outputted as output of the whole circuit. In the case when the outputs of the two-input NAND gates 12, 13 are selected in this constitution, the data and the set signal applied to the D flip-flop 11 are simply outputted from the selector circuits 14, 15 not passing through the D flip-flop 11. Therefore the relationship between the input and the output can be dealt with entirely as those of a combination circuit.

Figure 4:
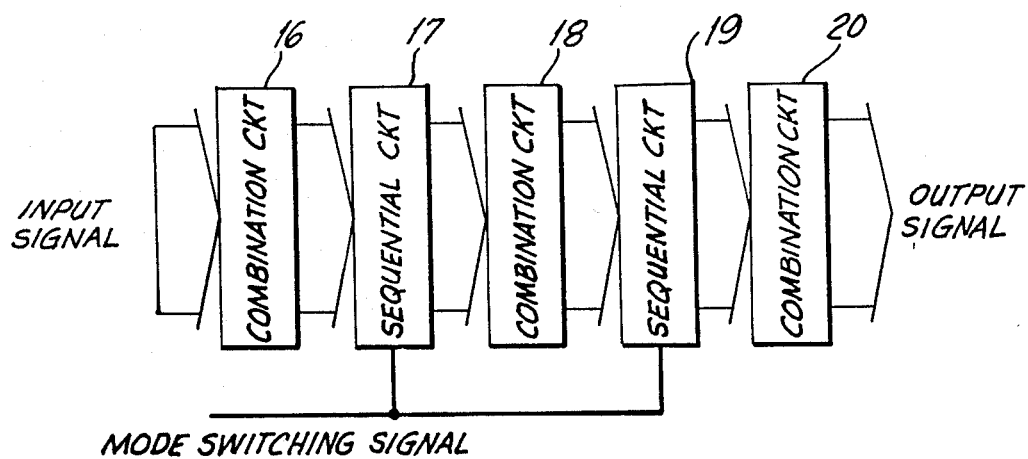
FIG. 4 is a block diagram showing a logic circuit which can be formed with the first embodiment of the present invention.

An example of usage of the first embodiment of the present invention is shown in FIG. 4. The combination circuits 16, 18, 20 and the sequential circuits 17, 19 are connected alternately in series. The first embodiment is applied to the sequential circuit 17, 19. All the sequential circuit groups 17, 19 can be turned into combination circuits by the mode switching signal M1, and consequently the preparation of test patterns is facilitated very much by simply transferring test signal through the series circuit of the combination circuit 16, 18, 20 and the sequential circuit 17, 19 which are turned into combination circuit, to the stage to be tested or from the stage to be tested.

Figure 5:
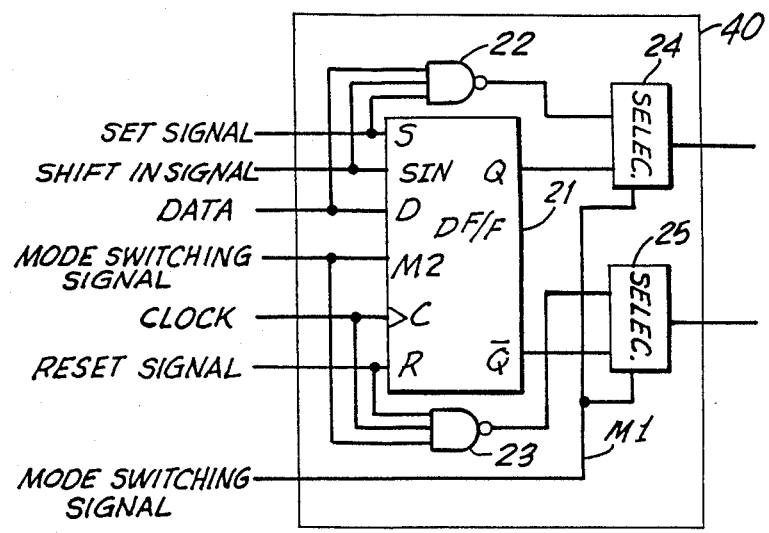
FIG. 5 is a block diagram showing a second embodiment of the present invention.

FIG. 5 is a block diagram showing a circuit 40 according to a second embodiment of the present invention. The circuit 40 is designed for use in a scan-path system. For this purpose, a D flip-flop 21 employed in the circuit 40 has a terminal SIN for a shift-in signal and a terminal M2 for an additional mode switching signal in addition to the terminals provided in the D flip-flop 11 used in the first embodiment of FIG. 3. The additional mode switching signal is used for selecting a data to be actually taken in between the data and the shift-in signal and will be later described with reference to FIG. 7. The set signal applied to the set signal input terminal S, the shift-in signal, and the data applied to the data input terminal D are applied to a three-input NAND gate 22, the output of which is in turn applied to a selector circuit 24 together with the output signal produced at the output signal terminal Q. The additional mode switching signal, the clock applied to the clock input terminal C and the reset signal applied to the reset signal input terminal R are applied to another three-input NAND gate 23, the output of which is in turn applied to another selector circuit 25 together with the inverted output signal produced at the inverted output signal terminal Q̄. The selections of output signals in the selector circuits 24 and 25 are controlled by the mode switching signal M1.

Figure 7:
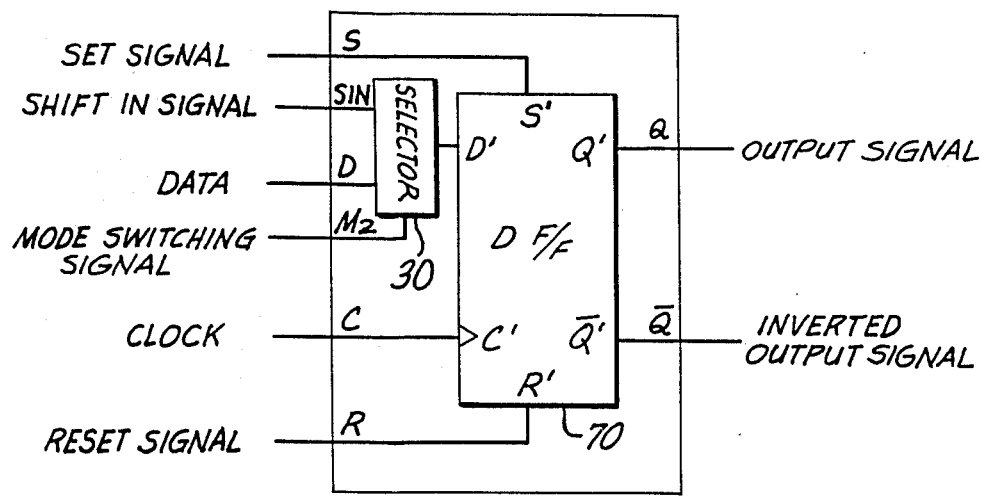
FIG. 7 is a block diagram of a flip-flop circuit usable in the second embodiment of the present invention.

The D flip-flop 21 is constructed with a basic part 70 of flip-flop and a selector circuit 30 as shown in FIG. 7. The shift-in signal and the data are applied to the selector circuit 30 to be selectively applied to the data input terminal D' of the basic part 70 under a control with the additional mode switching signal. The set signal at the set signal input terminal S, the clock at the clock input terminal C and the reset signal at the reset signal input terminal R are directly applied to the corresponding terminals S', C' and R' of the basic part 70, respectively. The output signal at the output signal terminal Q' and the inverted output signal at the inverted output terminal Q̄' are also directly applied to the corresponding terminals Q and Q̄ of the D flip-flop 21, respectively.

The circuit 40 operates as a combination circuit by selecting the output signals from the three-input NAND gates 22 and 23 as the outputs of the circuit 40 by the selector circuits 24 and 25. The circuit 40 operates as a sequential circuit, that is, a flip-flop by selecting the data applied to the data input terminal D by the selector circuit 30 and selecting the output signals produced at the output signal terminals Q and Q̄ by the selector circuits 24 and 25. The circuit 40 also operates as a one stage of a shift-register by selecting the shift-in signal at the shift-in signal input terminal SIN by the selector circuit 30 and selecting the output signals produced at the output signal terminals Q and Q̄ by the selector circuits 24 and 25.

Figure 6:
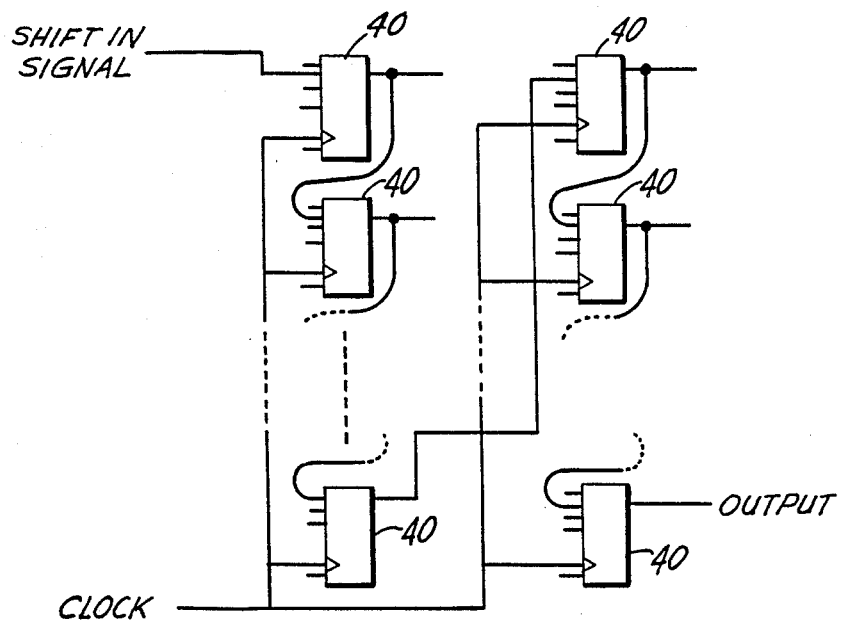
FIG. 6 is a block diagram of a scan-path circuit which can be formed with the second embodiment of the present invention.

Due to the operation of the one stage of a shift-register, the circuit 40 can be used in a scan-path system. One example of the scan-path system is shown in FIG. 6. A plurality of circuits 40 are arranged so as to be connected in series by wiring the output of the selector circuit 24 to the shift-in signal terminal SIN of the next stage circuit. A clock is commonly applied to all the circuits 40. By selecting the shift-in signal by the selector circuit 30 and selecting the output signal Q by the selector circuit 24, the circuits are connected in series to form a scan-path through which a test signal is introduced or derived.

As described above, the present invention enables the simplification of tests by turning a flip-flop circuit into a combination circuit. According to the embodiment shown in FIGS. 5 to 7, in particular, the realization of a scan-path system is enabled, and therefore even the ascertainment of the functions of the entire flip-flop circuit itself for its operation is enabled, in addition to the simplification of the ascertainment of connections between flip-flops by turning them into combination circuits.

What is claimed is:
1. A logic circuit comprising:
a flip-flop having a data input terminal for selectively receiving an input data, a control signal input terminal for receiving a control signal, a set signal input terminal for receiving a set signal, a reset signal input terminal for receiving a reset signal, an output signal terminal for producing an output signal and an inverted output signal terminal for producing an inverted output signal;

a first logic circuit performing a first logical arithmetic of said input data and said set signal to produce a first logic signal;

a second logic circuit performing a second logical arithmetic of said control signal and said reset signal to produce a second logic signal;

a first selector producing a selective one of said output signal and said first logic signal; and a second selector producing a selective one of said inverted output signal and said second logic signal.

2. A logic circuit as claimed in claim 1, wherein said flip-flop further has a shift-in signal input terminal receiving a shift-in signal, a third selector selecting a data signal for a flip-flop operation between said input data and said shift-in signal and a mode switching signal terminal receiving a mode switching signal for controlling said third selector, said first logic circuit performing said first logical arithmetic of said input data, said set signal and said shift-in signal, and said second logic circuit performing said second logical arithmetic of said control signal, said reset signal and said mode switching signal.

3. The logic circuit of claim 1 wherein said first and second selectors each have a mode switching signal terminal and select either said output and inverted output signals or said first and second logic signals in response to mode switching signals applied to both said mode switching signal terminals.

4. A logic circuit convertible between a sequential mode and a combination mode comprising;

a flip-flop having input terminals for receiving a data signal, a set signal, a control signal and a reset signal, and having output terminals for producing an output signal and an inverted output signal, a first NAND gate connected to produce a first logic signal in response to said received data and set signals, a second NAND gate connected to produce a second logic signal in response to said received control and reset signals, a first selector circuit connected to receive said first logic signal and said output signal, a second selector circuit connected to receive said second logic signal and said inverted output signal, said first and second selector circuits each having a mode switching terminal and selecting either said output and inverted output signals or said first and second logic signals in response to mode switching signals applied to said mode switching terminals.

5. The logic circuit of claim 4 also comprising;

a third selector circuit having input terminals for receiving a shift-in signal and a data signal, an output terminal connected to the data input terminal of said flip-flop, and a mode switching terminal for selecting either said shift-in signal or said data signal to be supplied to said flip-flop in response to a received mode switching signal, said first NAND gate being also responsive to said shift-in signal in addition to said set and data signals, and, said second NAND gate being also responsive to said mode switching signal of said third selector in addition to said control and reset signals.

* * * * *

REEXAMINATION CERTIFICATE (1755th)

United States Patent [19]
Aso

[11] B1 4,933,575

[45] Certificate Issued Jul. 21, 1992

[54] ELECTRIC CIRCUIT INTERCHANGEABLE BETWEEN SEQUENTIAL AND COMBINATION CIRCUITS

[75] Inventor: Akira Aso, Tokyo, Japan

[73] Assignee: NEC Corporation

Reexamination Request:
No. 90/002,561, Jan. 31, 1992

Reexamination Certificate for:
Patent No.: 4,933,575
Issued: Jun. 12, 1990
Appl. No.: 310,443
Filed: Feb. 14, 1989

[30] Foreign Application Priority Data

Feb. 15, 1988 [JP] Japan .................................. 63-33338

[51] Int. Cl.[5] .................... H04Q 1/00; H03K 17/693;
    H03K 19/096; H03K 3/01
[52] U.S. Cl. .................................... 307/465; 307/468;
    307/469; 307/475; 364/716; 364/784;
    340/825.84; 340/825.86; 340/825.87;
    340/825.91

[58] Field of Search ................ 307/291, 465, 463, 518,
    307/276, 475; 328/195, 204, 206, 104, 137, 154

[56] References Cited

U.S. PATENT DOCUMENTS

| | | | |
|---|---|---|---|
| 4,742,252 | 5/1988 | Agrawal | 307/465 |
| 4,745,573 | 5/1988 | Lebel | 307/465 X |
| 4,783,606 | 11/1988 | Goetting | 307/465 |
| 4,786,829 | 11/1988 | Letcher | 307/465 |

*Primary Examiner*—Timothy P. Callahan

[57] ABSTRACT

There is provided a logic circuit formed of a flip-flop receiving an input data, a control signal, a set signal and a reset signal and producing an output signal and an inverted output signal. To this is added a first logic circuit performing a first logical arithmetic of the input data and the set signal to produce a first logic signal, and a second logic circuit performing a second logical arithmetic of the control signal and the reset signal to produce a second logic signal. A first selector circuit selects one of the first logic signal and the output signal and a second selector circuit selects one of the second logic signal and the inverted output signal thereby providing convesability between sequential and combination modes of operation.

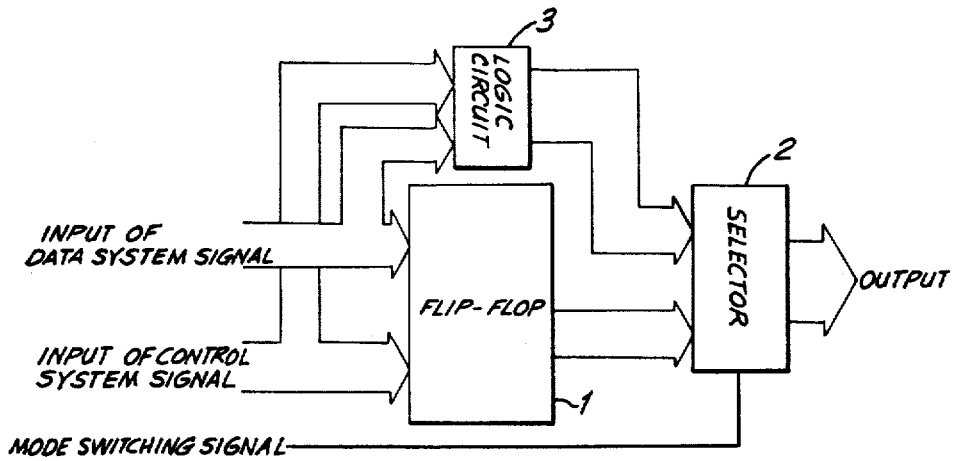

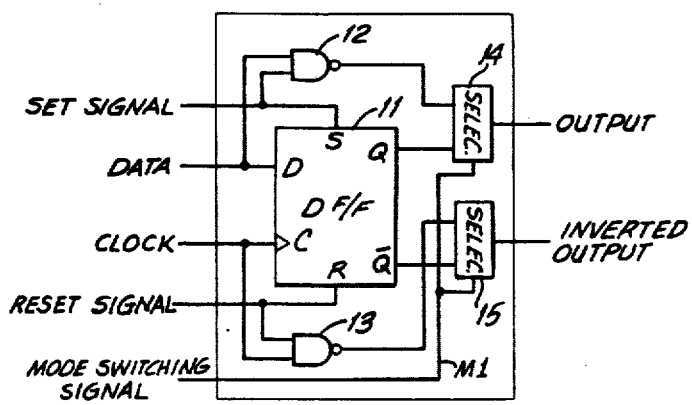

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-5 is confirmed.

* * * * *